United States Patent [19]
Song et al.

[11] Patent Number: 5,991,198
[45] Date of Patent: Nov. 23, 1999

[54] LOCAL ROW DECODER AND ASSOCIATED CONTROL LOGIC FOR FOWLER-NORDHEIM TUNNELING BASED FLASH MEMORY

[75] Inventors: Paul Jei-Zen Song, Sunnyvale; Keyhan Sinai, Santa Clara, both of Calif.

[73] Assignee: NexFlash Technologies, Inc., Santa Clara, Calif.

[21] Appl. No.: 09/054,423

[22] Filed: Apr. 2, 1998

[51] Int. Cl.[6] .................................................. G11C 16/04
[52] U.S. Cl. .................................. 365/185.11; 365/185.13
[58] Field of Search .......................... 365/185.11, 185.22, 365/185.23, 185.29, 185.28, 185.19, 185.18, 185.13

[56] References Cited

U.S. PATENT DOCUMENTS

5,745,417  4/1998  Kobayashi et al. ................. 365/185.29
5,748,528  5/1998  Compardo et al. ................. 365/185.11
5,805,501  9/1998  Shiau et al. ........................ 365/185.11

*Primary Examiner*—David Nelms
*Assistant Examiner*—Anh Phung
*Attorney, Agent, or Firm*—Pennie & Edmonds, LLP

[57] ABSTRACT

A semiconductor non-volatile memory device is disclosed which is based on the use of Fowler-Nordheim electron tunneling to charge and discharge the isolated gates of the storage cells. Furthermore, the disclosed memory device includes global decoder circuitry capable of passing either positive or negative voltages to a set of global word lines controlling-local decoder circuitry, said local controller circuitry in turn controlling row select lines or local word lines. Each local decoder controls a multiplicity of word lines. The local decoder circuitry is located in physical proximity to specific memory sectors thus resulting in an improved layout of the decoder circuitry and enabling the selection of one of the multiplicity of word lines within said sector by means of electrical control lines. The electrical control lines select one of the multiplicity of rows within a memory sector and deselect all the remaining rows. Logic control circuitry is provided to control the logic of the local row decoders.

12 Claims, 6 Drawing Sheets

FIG. 1

FIG. 2
READ MODE

FIG. 3 WRITE MODE

FIG. 4
ERASE MODE
Sector = Global WL
Select Global = 0

FIG. 6

LOCAL ROW DECODER AND ASSOCIATED CONTROL LOGIC FOR FOWLER-NORDHEIM TUNNELING BASED FLASH MEMORY

The present invention relates generally to non-volatile random access semiconductor memory devices wherein data can be written and erased by electrical means and, more particularly, to a non-volatile semiconductor memory device having local decoders for addressing specific memory sectors.

BACKGROUND OF THE INVENTION

The structure and functionality of non-volatile random access semiconductor memory devices has evolved in the last decade in order to match the specific needs and requirements of data storage and processing. Non-volatile memory devices are useful in many applications whenever data must be retained after devices are powered off. Upon restart of many computing or entertainment devices, initialization data must be available to enable a processor to load its programs and operating systems from peripheral storage such as hard-disks or optical compact disks. Desirable features of non-volatile semiconductor memory devices include large capacity, high speed of writing, high speed of readout, repeated erasability, ease of writing and erasing of data as well as specific practical features that may allow for example reading or writing to specific sectors within the memory while protecting other sectors.

An early example of erasable non volatile memory is the Erasable Programmable Read Only Memory or EPROM. Such EPROM devices comprise a multiplicity of memory cells generally arranged in arrays of several thousand cells on the surface of a semiconductor chip, each cell comprising one or more metal oxide semiconductor (MOS) transistors. Each MOS transistor has a first control gate which consists of a metallic area separated from the drain or depletion area of the transistor by a thin oxide film and a second electrically insulated gate located between the control gate and the drain. Such cells retain the data in the form of stored electrical charge on the insulated gate. In order to erase an EPROM electrons generated by ultraviolet radiation from a special erase lamp are utilized. Such devices necessarily require the erasing of all sectors of the memory followed by a re-write of the new data to all sectors of the memory. The rewrite operation consists of injecting hot electrons into the floating gate. Such write-erase processes can be time consuming and subject to error generation especially if only small sections of the data stored need to be modified. An EPROM generally requires a high-voltage supply with substantial current-generating capability to generate the hot electrons. Furthermore, the process of generating hot electrons degrades the transistor gate regions, which limits the number of erase write cycles that can be performed.

A more recent type of memory device called EEPROM or electrically erasable PROM, utilizes tunneling electrons generated by the application of a high voltage difference between a control gate located above the insulated gate and the drain region of the MOS transistor, to pump he into or out of the insulated gate. An EEPROM Is distinguished from an EPROM by two features:

1) the program and erase operations can be accomplished on a byte-by-byte basis, whereas in an EPROM, the erase operation is global and only the program operation is byte-by-byte; and
2) the mechanism underlying the program and erase operations in an EEPROM is Fowler-Nordheim (FN) tunneling, whereas, in an EPROM, it is hot-electron injection for programming (typically a high-current mechanism), and UV-erase for the erase operation.

Flash EPROMs, which have become the standard non-volatile memory are hybrid devices, share features of the EPROM and EEPROMS. That is, similarly to EPROMS, flash memories have a global (or sector, in more recent types) erase mode. Similarly to EEPROMS, flash memories can be erased and programmed electrically. The characteristics of the different types of non-volatile memory are summarized in Table 1. The present invention is implemented in a flash EPROM with tunneling program and sector tunneling erase. The basic operation of a Fowler-Nordheim flash EPROM is now described in reference to FIG. 1.

TABLE 1

| Memory Type | Program Mechanism | Erase Mechanism |
| --- | --- | --- |
| EPROM | hot-electric (high current) | global (non-byte) UV |
| EEPROM | FN-tunneling (low current) | FN-tunneling (byte operation) electrical |
| Flash EPROM | hot-electron or tunneling injection | FN-tunneling global or semi-global (non-byte) electrical operation |

Figure 1:
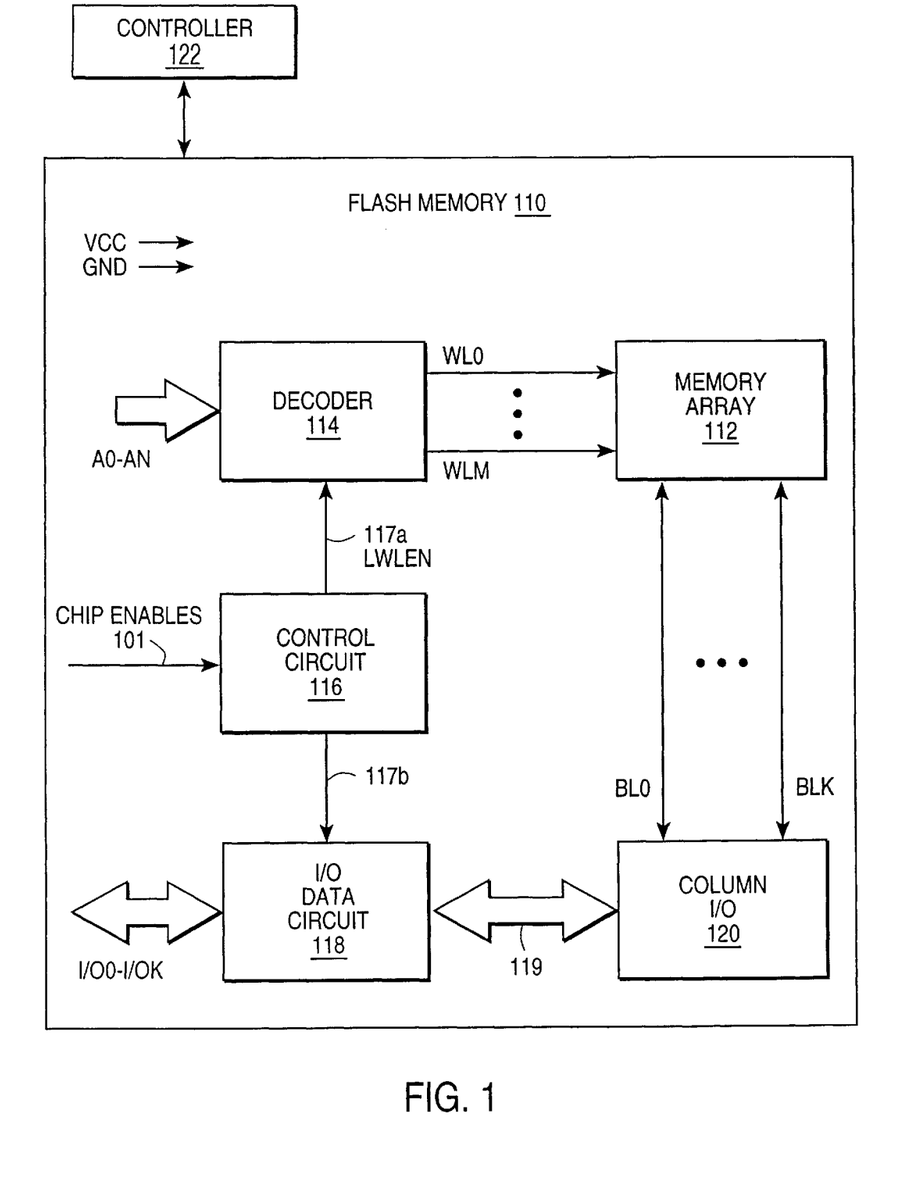
FIG. 1 is a block diagram of a typical flash memory characteristic of both the prior art and the present invention.

Referring to FIG. 1, there is shown a block diagram of a flash memory 110. This block diagram is also representative of the architecture of other types of memories. The flash memory 110 includes a memory array 112, an address decoder 114, a control circuit 116, an input/output (I/O) data circuit and a column I/O circuitry 120. The memory 110 operates in response to external signals provided by a controlling deice 122, such as a microprocessor.

The principle of operation of flash memories, such as the memory 110, is well known and therefore is only briefly described herein. The controller 122 initiates a memory operation by asserting a chip enable signal 101 and supplying address signals A0–AN (corresponding to 2 N+1 memory locations) designating the address of a memory location where the operation is to be performed. If the memory operation is a write operation, the controller 122 supplies the data to be written to the addressed memory location via the bi-directional input output lines 1/O0–I/Ok (corresponding to k+1 bit memory words). If the memory operation is a read operation, the stored information from the addressed location is read out from the same bi-directional input output lines 1/O0–1/Ok. The memory 110 also provides connections for external power supply (Vcc) and ground (GND) signals.

The heart of the memory 110 is the memory array 112, which consists of flash memory cells, each capable of storing one bit of data, arranged in rows and columns. In the conventional manner, all of the cells in one row are energized for a memory operation (either a read or a write) by a word line WL uniquely associated with that row. A memory operation cannot be performed unless the word line associated with the target row of cells is activated.

At least a subset of the cells in a row (typically all of the cells that store data for one memory word) can be accessed simultaneously for a given memory operation via the bit lines BL. When the memory operation is a read, the bit lines BL are coupled to sense amplifiers in the column I/O 120 that "sense" the data stored in the corresponding cells of the row whose word line WL is active. When the memory operation is a write operation the bit lines BL carry the signals used to program the corresponding cells of the row associated with the active word line.

The control circuitry 116 controls the other blocks of the memory 110 in accordance with the chip enables 101. Depending on the operation to be performed, the control circuitry issues the appropriate control signals 117a, 117b to the decoder 114 and the I/O data circuit, respectively.

Regardless of whether the memory operation is a write or a read, the decoder 114 decodes the address signals A0–AN and activates the word line WL of the row that includes the memory word that is the target of the current memory operation. If the operation is a write, the I/O data circuitry 118 buffers the input data signals I/O0–I/Ok and outputs the buffered data to the column I/O 120 via the bi-directional data bus 119. The column I/O 120 then latches the input signals in parallel onto the corresponding bit lines BL0–BLK The signals on the bit lines BL0–BLK are used to program the cells composing the word whose word line was activated for the current operation by the decoder 114.

If the operation is a read, sense amplifiers in the column I/O 120 sense the signals on the respective bit lines BL, convert the sensed signals into binary (e.g., high or low) voltages that represent the programmed state of the addressed word and output the word's bit values to the I/O data circuit via the bi-directional bus 119. The output data are buffered by the I/O data circuit 118 and latched onto the bi-directional data lines I/O0–I/Ok for use by the controller 122.

The operation so far described is typical of most memories. The memory operations proceed cell by cell with all other cells de-selected. This process can be very time consuming if each cell requires a few milliseconds to charge up or be discharged. Furthermore, the number of column select lines must be on the order of 1000 lines for a 100 kilobyte memory. Thus, the column and row decoder circuitry required to deoode the addresses and turn on the appropriate column and row lines is quite large. Moreover the layout of the row and column select lines affects the operation of the overall memory circuitry. In general, long select lines are detrimental to the reliable operation of flash type EPROM memory chips.

Accordingly, it is an object of the present invention to provide a new, hierarchical method of selecting row and column lines that enables read, write, program, erase-verify and program verify operations in a flash EPROM utilizing both positive and negative high voltages during program and erase. It is also an object of the present invention to reduce the size and complexity of the address-decoding circuitry and to improve the physical layout of the memory circuit.

SUMMARY OF THE INVENTION

In summary, the present invention defines local word line decoder and control circuitry for use in a semiconductor non-volatile memory device that employs Fowler-Nordheim electron tunneling to charge and discharge the isolated gates of the storage transistors.

In particular, the disclosed memory device includes global decoder circuitry capable of switching either positive or negative voltages generated elsewhere in the chip to a set of control circuitry controlling local decoder circuitry. The local decoder circuitry in turn controls row select lines or local word lines. The output of each controller circuit is a global word line that controls a multiplicity of local word lines. In this embodiment, the global wordline is active low, meaning the least voltage level (Vss or negative high-voltage ) selects the corresponding row. The local decoder circuitry is located in physical proximity to specific memory sectors. This configuration results in an improved layout of the decoder circuitry and enables the selection of one of the multiplicity of word lines within a memory sector by means of electrical control lines. The electrical control lines select one of the multiplicity of rows within a memory sector and deselect all the remaining rows. Novel control circuitry is provided to control the logic of the local row decoders.

In a data write operation the control circuitry acts like an inverter to invert a negative high voltage (where high means larger than Vcc or lower than Vss) control signal (logic '0') from the selected global decoder to a 0 V (logic '1') signal at the corresponding global word line. The local decoders associated with the control circuit in turn apply the negative high voltage to the selected word line and 0 V to deselected word lines.

In a data read operation the control circuitry passes a 0 V signal from a selected global word line to the corresponding selected sector global word lines and passes a Vcc signal to all deselected global word lines. The local decoder circuits in turn apply Vcc to the selected word line and 0 V to deselected word lines.

In a data erase operation the control circuitry passes a 0 V signal from a selected global decoder to the corresponding selected sector global word lines and passes a positive high voltage signal from deselected global word lines to the corresponding deselected sector global word line. In turn, the local decoder circuitry applies the positive high voltage to all the local word lines corresponding to the selected sector global word line and 0 V to all deselected sector local wordlines.

The data erase operation charges all the cells in a selected memory sector. The data write operation writes data to a selected row of cells. The local decoder holds all deselected rows solidly at ground potential to insure proper operation.

BRIEF DESCRIPTION OF THE DRAWINGS

Additional objects and features of the invention will be more readily apparent from the following detailed description and appended claims when taken in conjunction with the drawings, in which:

DESCRIPTION OF THE PREFERRED EMBODIMENT

Figure 2:
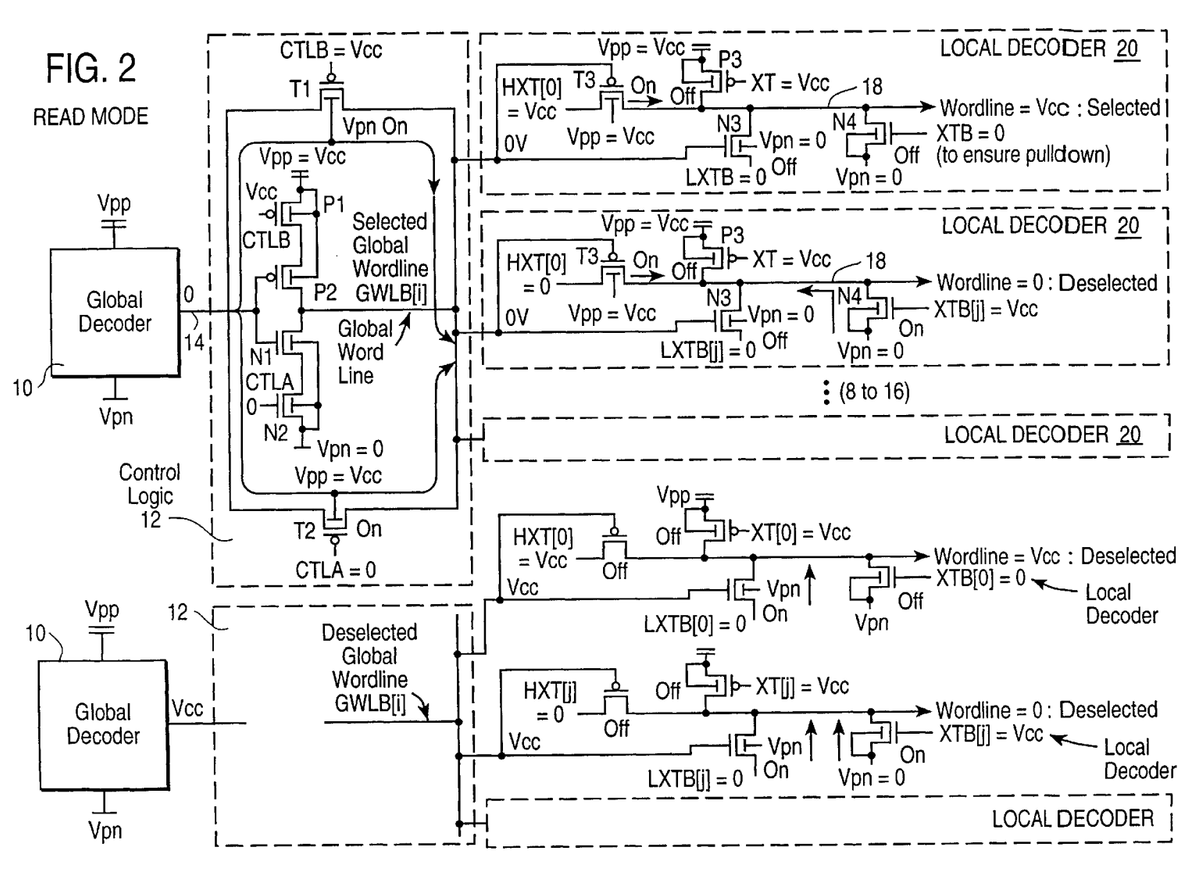
FIG. 2 is a circuit diagram of the preferred embodiment showing the data read mode of operation.
Figure 3:
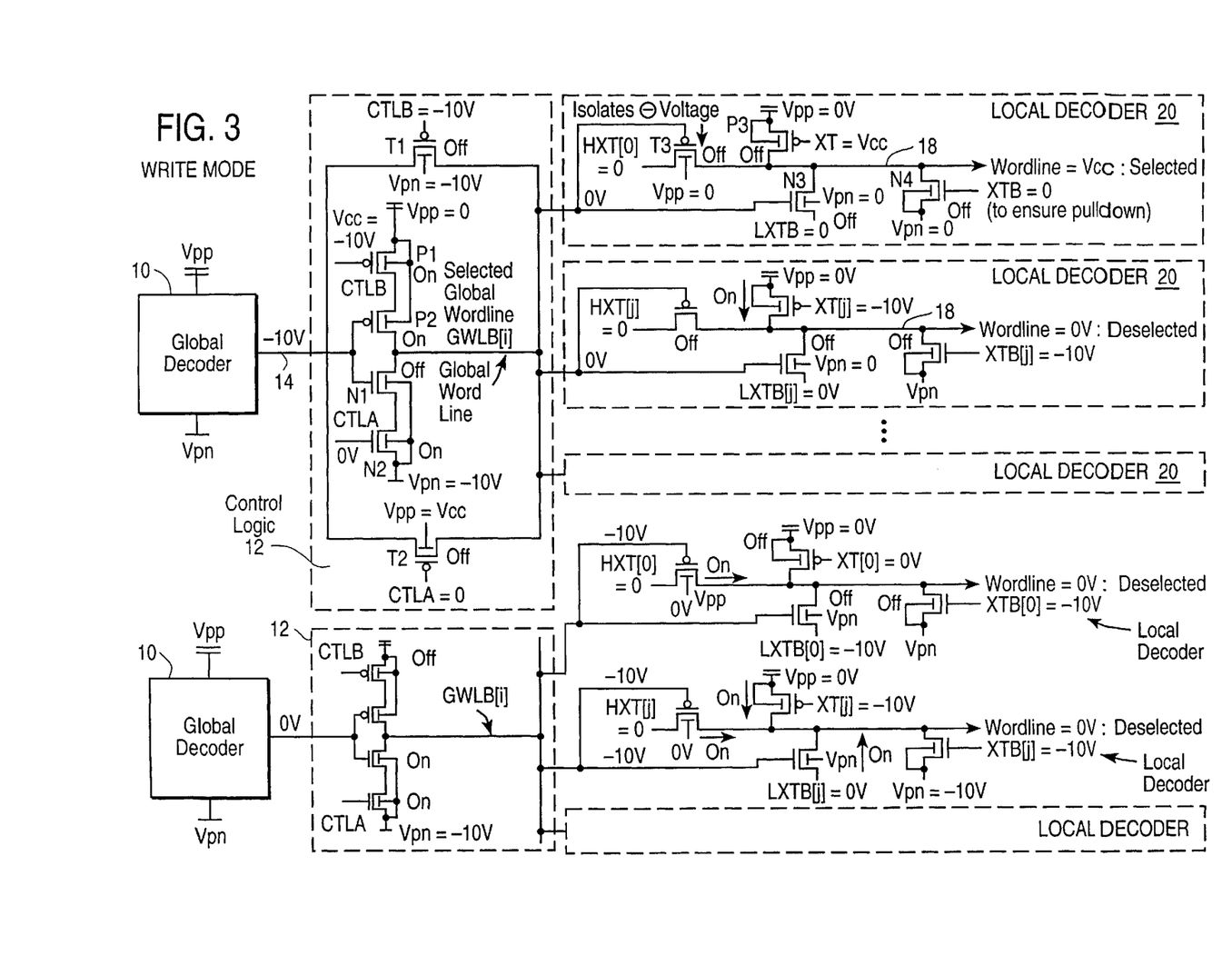
FIG. 3 is a circuit diagram showing the preferred embodiment and illustrating the data write mode of operation.
Figure 4:
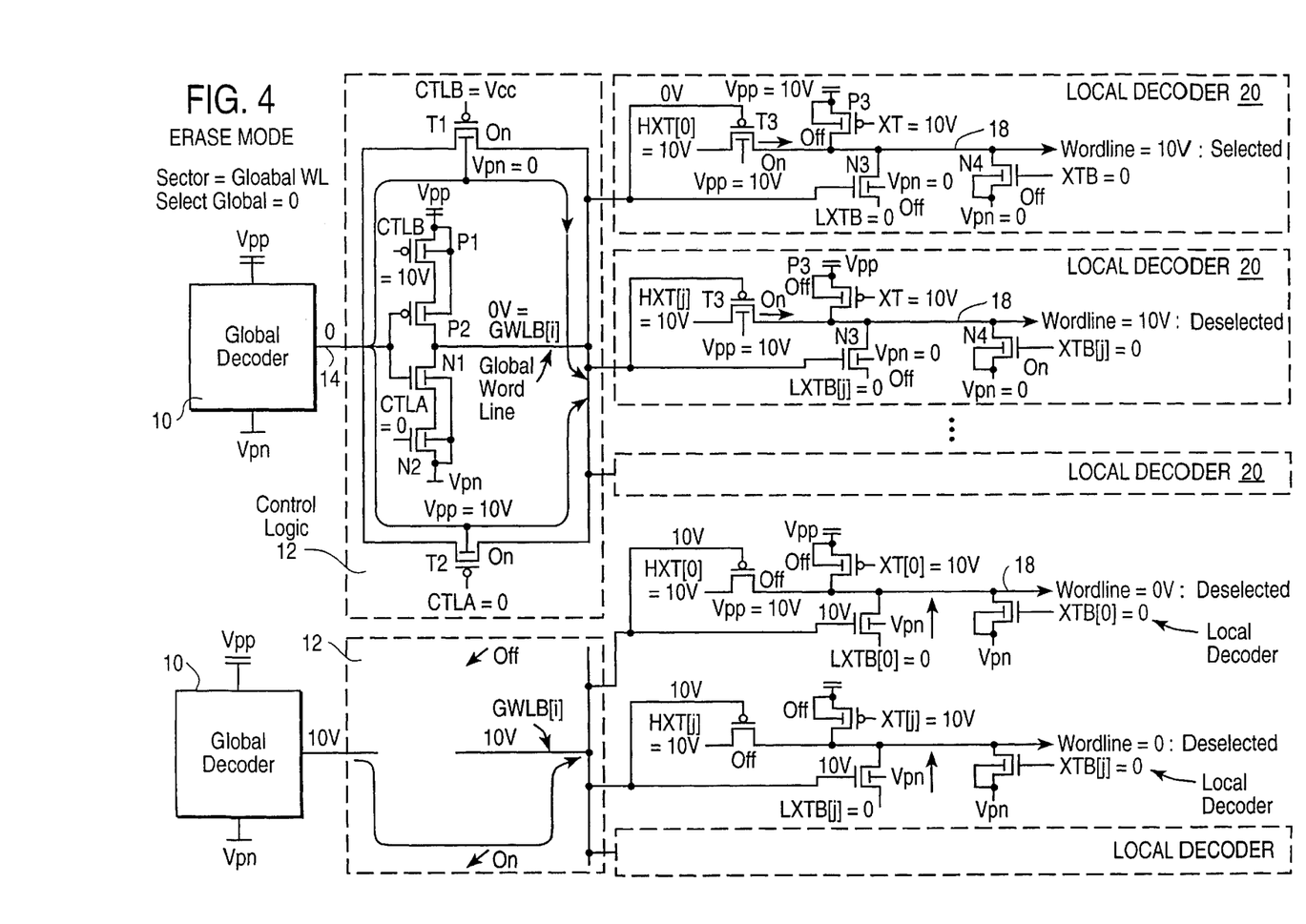
FIG. 4 is a circuit diagram showing the preferred embodiment and illustrating the data erase mode of operation.

Referring to FIGS. 2 through 4, there is shown a circuit diagram of the present invention, which can be utilized within the decoder 114 of FIG. 1. FIG. 2 shows specifically the voltage levels corresponding to a read operation, FIG. 3 shows the voltages corresponding to a write operation and FIG. 4 shows the voltage levels corresponding to an erase operation. The following description of the circuit structure applies to FIGS. 2 through 4.

The circuitry of the present invention includes a multiplicity of global word line decoders 10 having Vpp and Vpn as power supply inputs. Each global decoder selects or deselects a corresponding global word line GWLB by setting it to Vpn or Vpp, respectively, except in program mode, when selected GWLB are switched to Vpp and deselected GWLB to Vpn. A global decoder can be a row or a column decoder; however, in the preferred embodiment, the global decoders are word line decoders.

The output 14 of the global decoder constitutes one of the inputs to a corresponding control logic circuit 12. The remaining control logic input lines include CTLA, CTLB, and power supply inputs Vpp and Vpn. Within each control logic circuit 12 there are three p-channel MOS transistors P1, P2 and T2, and three N-channel MOS transistors N1, N2 and T1. The CTLA input is connected to the gate of the transistor T2. The input of T2 is connected to the output 14 of a global decoder 10, the output of T2 is connected to the output GWLB[i] of the i-th control logic circuit 12 and the bulk of T2 is connected to Vpp. The CTLB input is connected to the gate of transistor T1. The input of T1 is connected to an output 14 of a global decoder 10, the output of T1 is connected to an output GWLB[i] of a control logic circuit 12[i] and the bulk of T1 is connected to Vpn. Note that Vpp and Vpn vary depending on the mode of operation. Thus T1 and T2 are capable of acting as transfer devices connecting the output 14 of a global decoder 10 to the inputs of the corresponding local decoders 20.

Also within the control circuit 12, the output 14 of a global decoder is connected to the gates of the transistors N1 and P2. All of the transistors P1, P2, N1, N2 are connected in series in an inverter type configuration and the connection between transistors P2 and N1 is further connected to the output GWLB[i] of a control logic circuit 12. P1 and P2 are able to pass Vpp to the output GWLB[i] of a control logic circuit 12 while N1 and N2, when both are active, are able to pass Vpn to the output GWLB[i]. The transistors P1, P2, N1 and N2 are capable of acting as an inverter in the programming operation.

The output GWLB[i] of each control logic circuit 12 is connected to a multiplicity of local decoders 20. As an example each output of the control logic circuit 12 may be connected to 8 or 16 local decoder inputs. Each local decoder output 18 is a local word line and is connected to the gates of the storage cells in a row. The set of all storage cells controlled by several global decoders 10 is a memory sector.

Within each local decoder 20 are two p-channel MOS transistors T3 and P3, and two n-channel MOS transistors N3 and N4. In addition to GWLB[i], the local decoders 20 have three other inputs labeled HXT[j], XTB, LXTB and power supplies Vpp and Vpn. All HXT[j] signals with the same sub-label [j] are connected together. For example the HXT[0] lines from different sectors are connected together and the HXT[3] lines from different sectors are connected together. Therefore, within a sector each sub-label [j] corresponds to a specific j-th row local word line. HXT[j] is connected to the input of transistor T3, the source of transistor T3 is connected to a local word line 18 and the bulk of T3 is connected to Vpp. Transistor P3 connects between Vpp and a local word line 18 and serves to pull up a word line 18 to Vpp. The gate of P3 is controlled by XT. The transistor N3 connects a word line 18 to LXTB and its gate is connected to the output GWLB[i] of a control logic circuit 12[i]. The transistor N4 connects, the word line to Vpn and its gate is connected to XTB. Both transistors N3 and N4 ensure that the word line is solidly grounded for deselected rows during various operations.

In a first preferred embodiment the physical layout of the memory device is such that all four transistors T3, P3, N3, N4 corresponding to the word line 18, are located near one end of that word line 18. In a second embodiment the transistors T3 and P3 are located near one end of a word line 18 while N3 and N4 are located near the opposing end of the same word line 18. The operation of the preferred embodiment in the write, read and erase modes is now described.

Three types of data operations can take place in a flash type EPROM device within a time period defined by an on-chip timer and a chip enable signal: data read, data write and data erase. These three types of operation will be referred to as modes. In this invention the read mode operation is carried out a byte at a time, the write mode of operation is carried out a row at a time and the erase mode of operation is carried out a sector at a time. There are also two other modes which can be considered subsets of read: program verify and erase verify.

Table 2 shows the voltages applied to the different control lines GWLB[I], HXT, XT, XTB, LXTB, CTLA, CTLB and supplies Vpp and Vpn in the read mode of operation. Table 3 shows the voltages applied to the same control lines in the write mode of operation and Table 4 shows the voltages applied to the control lines in the erase mode of operation. In Tables 2 through 4 the first column indicates whether a word line is selected or deselected. Note that in the read mode, a word line can be selected by applying 0 V to the GWLB global word line, Vcc to the HXT and XT control lines and 0 V to the XTB control line. Deselecting a word line in the read mode can be done in three different manners as shown in Table 2, depending on whether that word line lies within a selected or a deselected sector.

TABLE 2

| | Read Mode | | | | | | | | |
|---|---|---|---|---|---|---|---|---|---|
| word line | GWLB[j] | HXT[i] | XT[i] | XTB[i] | LXTB[i] | CTLB | CTLA | Vpp | Vpn |
| select | 0V | Vcc | Vcc | 0V | 0V | Vcc | 0V | Vcc | 0V |
| deselect: GWLB[l], l ≠ j HXT[k], k ≠ i | Vcc | 0V | Vcc | Vcc | 0V | Vcc | 0V | Vcc | 0V |
| deselect: GWLB[j] HXT[k], k ≠ i | 0V | 0V | Vcc | Vcc | 0V | Vcc | 0V | Vcc | 0V |
| deselect: GWLB[l], l ≠ j HXT[i] | Vcc | Vcc | Vcc | 0V | 0V | Vcc | 0V | Vcc | 0V |

Referring to FIG. 2, there is shown the circuit of the present invention with arrows indicating the conducting paths through active transistors in the read mode. In the read mode a memory sector is selected by means of a global decoder 10. The selected global decoder has an output of 0 V while all de-selected global decoders have an output of Vcc. Transistors T1 and T2 within the corresponding control logic 12 conduct and pass the 0 V to the local decoders 20 of the selected memory sector. A specific row is selected by taking the corresponding line HXT[j] to a voltage Vcc. The transistor T3 conducts and passes Vcc to the selected word line while de-selected word lines are held at 0 V. The transistor N4 conducts in the de-selected rows j such that the corresponding HXT[j] is different from the selected row corresponding to HXT[i], holding de-selected word lines at 0 V. The transistor N3 conducts in de-selected rows of de-selected global word lines GWLB[j], holding these rows at LXTB[j]=0 V.

In the write mode the gates of all storage transistors in a selected row are held at a negative high voltage Vpn of about −10 V, while the drain of the storage transistor is connected to the line carrying the bit to be written. In this mode writing is enabled to all storage transistors in a row.

output is 0 V (logic 1). At the onset of the program mode, the control logic 12 changes its mode of operation from a transfer device to an inverting device. In order to make this transition possible, the CTLA signal needs to follow Vpp (i.e., transition from Vcc→0 V in response to Vpp making the same transition) and the CTLB signal must drop to 0 V immediately at the onset of programming. This ensures that both devices T2 and T1 are OFF and no current path is provided through T1 and T2 between the Vpp node of the control circuit 12 and the Vpn node of the global decoder 10. Such a leakage path could cause the voltage pump (not shown) that generates the negative high voltage to malfunction.

A key issue at the onset of programming is the leakage path from the Vpn to Vpp through the unselected global word line control circuitry. Initially, in a non-program mode, the output of the global decoder 10 and the control circuit 12 is a logical 1 (typically 3 V) for deselected GWLB. When the program mode is entered, the deselected GWLB must go to logical 0 (typically −10 V). Since, during programming, logical 1 is a positive voltage and logical 0 is a negative voltage, one must first discharge the deselected GWLB to a logical 1 (0 V) when program mode is entered, thereby,

TABLE 3

Write Mode

| word line | GWLB[j] | HXT[i] | XT[i] | XTB[i] | LXTB[i] | CTLB | CTLA | Vpp | Vpn |
|---|---|---|---|---|---|---|---|---|---|
| select | Vpp | Vpp | Vpp | Vpn | Vpn | 0V −> −10V | Vpp | Vcc −>0V | 0V −> −10V |
| deselect: GWLB[l], l ≠ j HXT[k], k ≠ i | Vpn | Vpp | | Vpn | Vpp | 0V −> −10V | Vpp | Vcc −>0V | 0V −> −10V |
| deselect: GWLB[j] HXT[k], k ≠ i | Vpp | Vpp | Vpn | Vpn | Vpp | 0V −> −10V | Vpp | Vcc −>0V | 0V −> −10V |
| deselect: GWLB[l], l ≠ j HXT[i] | Vpn | Vpp | Vpp | Vpn | Vpn | 0V −> −10V | Vpp | Vcc −>0V | 0V −> −10V |

The bulk of the storage transistors is held at 0 V and the source floats. If the bit line is high, electrons will tunnel from the isolated gate to the drain and a positive charge will be left in the isolated gate representing a zero. If the bit line is low, no tunneling occurs and the gate remains charged (with electrons), representing a one. Referring to FIG. 3 there is shown the circuit of the present invention in the write mode with arrows indicating the conducting paths through transistors in a conductive state. The selection of a row for writing is achieved by first selecting a sector through the corresponding global decoder 10 and making the output of that global decoder equal to −10 V. The selection of a global decoder is achieved by sending the level-shifted address word to that global decoder over the address bus. Level shifting the addresses prior to arriving at the global decoder saves considerable physical layout compared to the prior art, which employs local level shifting requiring space-consuming level shifters for each GWLB. Next, a row within the selected sector is addressed by holding the CTLB line at −10 V within the local decoder 12 and the LXTB line at −Vpn in the desired row. Transistors P1 and P2 will then conduct and apply Vpp to the global word line GWLB[i], and the transistor N3 will conduct and apply −Vpn to the local word line.

In program mode, the control logic acts as an inverter, since the input is −10 V (corresponding to logic 0) and the preventing this leakage path. This is accomplished by coupling the CTLA signal to the gate of the transistor N2, which, at the onset of programming, follows Vpp from Vcc (approx. 3 V) to 0 V. The leakage current problem is now described in greater depth with reference to FIG. 5.

Figure 5:
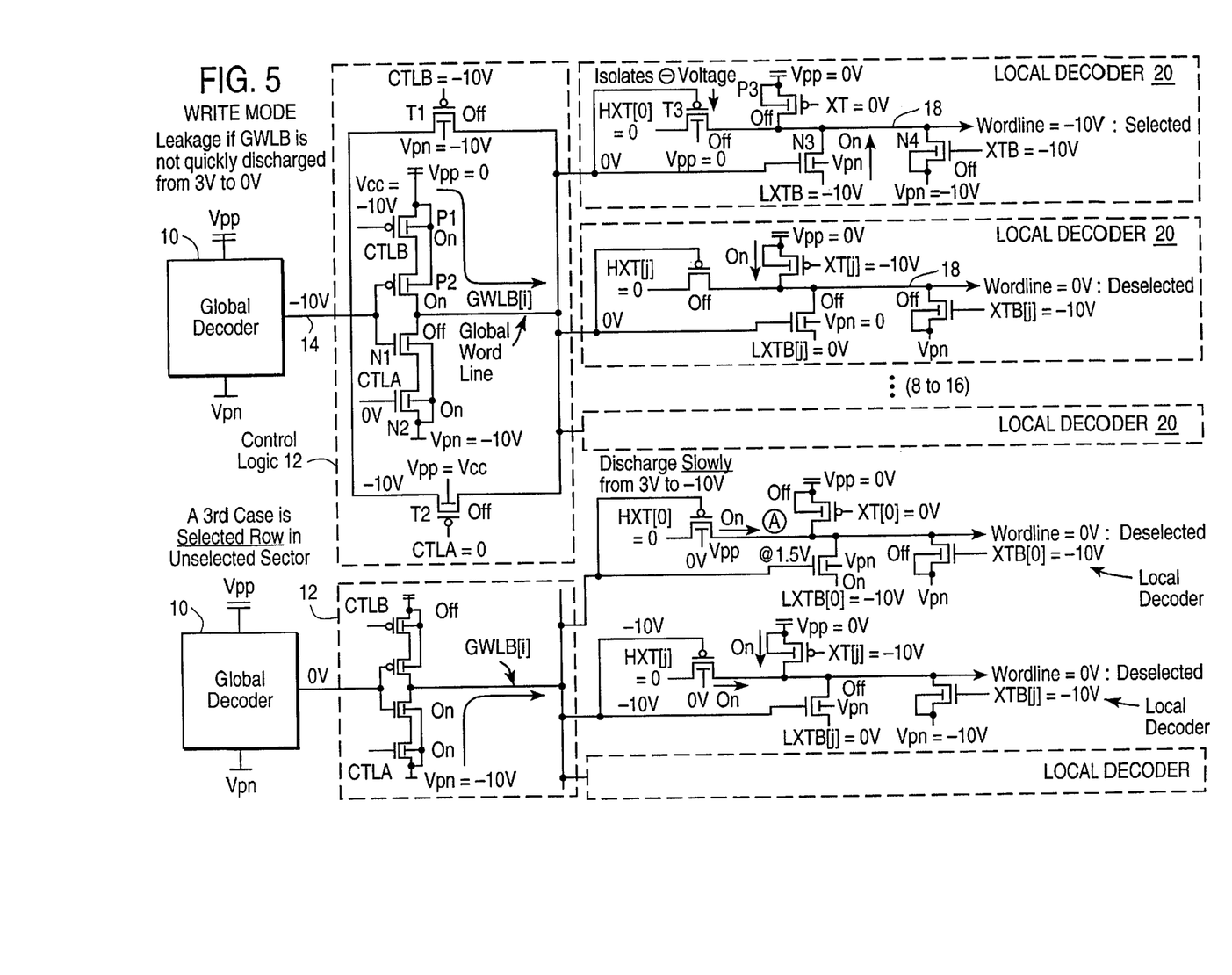
FIG. 5 is a circuit diagram of the preferred embodiment illustrating signal conditions that could cause leakage current to flow at the onset of programming but for the present invention's application of the CTLA signal to the gate of the transistor N2.

Referring to FIG. 5, there is shown a schematic of the present invention illustrating signal conditions that could cause leakage current to flow at the onset of programming but for the present invention's application of the CTLA signal to the gate of the transistor N2. As shown in FIG. 5, assuming that an unselected global word line GWLB were allowed to slowly discharge from 3 V to −10 V at the onset of programming, at some point it would reach 1.5 V, where both devices A and B would be partially on. As a result, a leakage path would momentarily exist from the LXTB node, which is pumped to −10 V through the transistors B and A, to the HXT node, which follows Vpp. Due to this leakage path, the negative pump(s) needed to generate the −10 V signals would not operate correctly.

Figure 6:
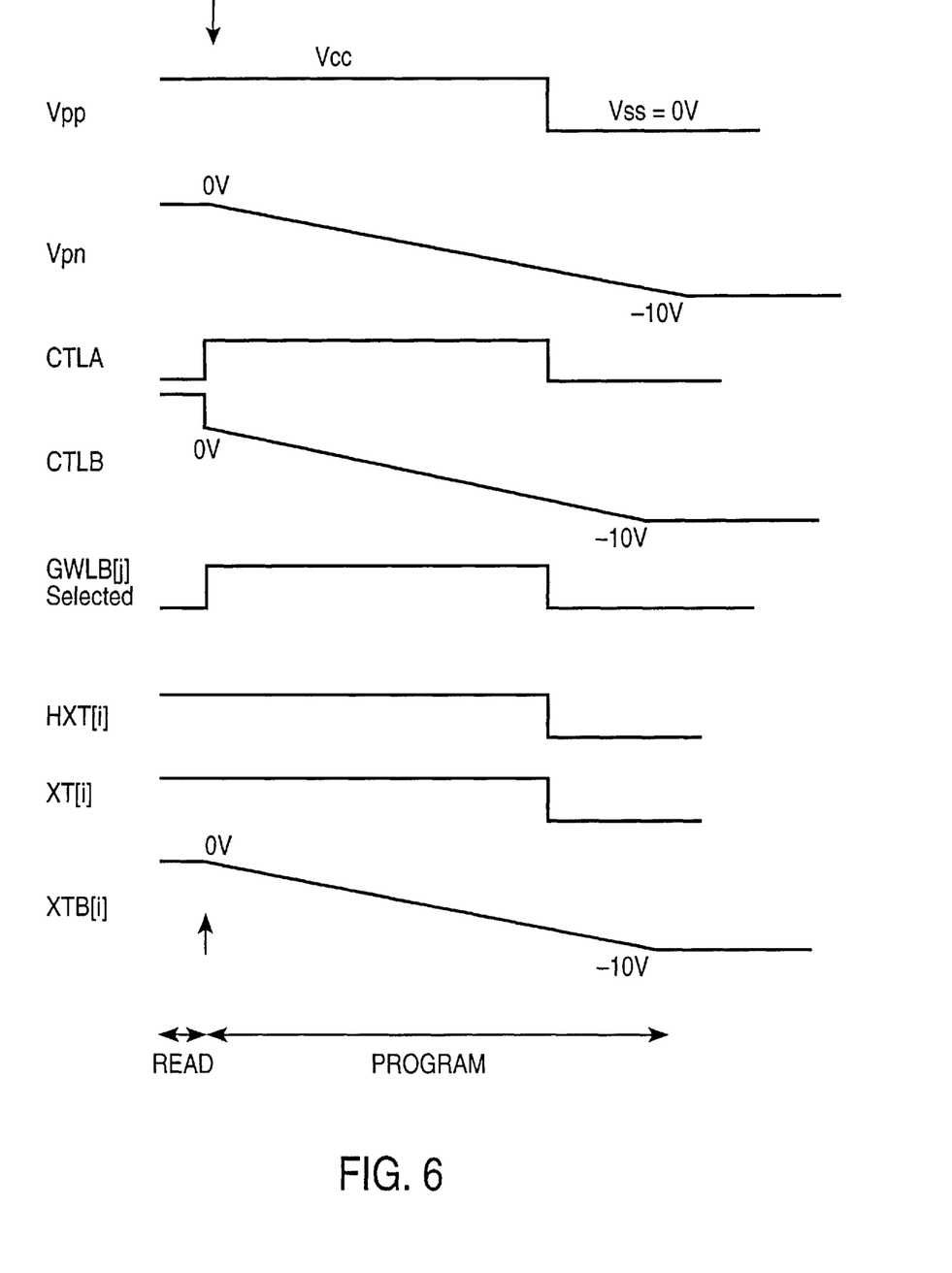
FIG. 6 is a timing diagram for the various signals (Vpp, Vpn, CTLA, CTLB, GWLB) described above prior to, during and after a program mode operation.

Referring to FIG. 6, there is shown a timing diagram for the various signals (Vpp, Vpn, CTLA, CTLB, GWLB) described above prior to, during and after a program mode operation.

TABLE 4

| | | | | Erase Mode | | | | |
|---|---|---|---|---|---|---|---|---|
| sector | GWLB | HXT | XT | XTB | LXTB | CTLA | CTLB | Vpp | Vpn |
| select | Vpn | Vpp | Vpp | Vpn | Vpn | Vpn | Vpp | 10V | 0V |
| deselect | Vpp | Vpp | Vpp | Vpn | Vpn | Vpn | Vpp | 10V | 0V |

Referring to FIG. 4, there is shown the circuit of the present invention with arrows indicating the conducting paths through active transistors in the erase mode. In the erase mode the control gates of all storage transistors in a sector are taken to a positive high voltage Vpp of about 10 V by selecting a sector through the corresponding global decoder. The output of the selected global decoder is Vpn=0 V. Transistors T1 and T2 in the control logic circuit 12 conduct and transmit the 0 V to the local decoders 20 of the selected sector. All HXT[i] signals are held at Vpp causing the transistor T3 to pass the 10 V to all word lines within a selected sector. All of the storage transistors in the selected sector are then charged.

Referring to FIG. 3, in an alternative embodiment, the p-channel transistor P1 is not present in the control circuitry 12. In this alternative embodiment the control circuitry 12 consists of five transistors, two in parallel (T1, T2) and three in series (P1, N1, N2). This configuration allows the control circuitry 12 to be made even smaller, providing a layout advantage over the preferred embodiment. However, this arrangement prevents this use of the CTLB signal as a control signal that can be used to determine when the Vpp signal is coupled to a selected global wordline GWLB. In the preferred embodiment, this end is accomplished by using the CTLB signal to determine when the Vpp signal is coupled to a selected global word line GWLB. This tradeoff may be acceptable in some operating environments.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

What is claimed is:

1. Control circuitry for use in a non-volatile electrically erasable semiconductor memory device capable of operating in read, program, erase, erase verify and program verify modes, comprising a multiplicity of storage sectors; each sector comprising a multiplicity of cells, each cell comprising a MOS transistor, said cells being arranged in rows, each row being controlled by a word line, said control circuitry comprising:

a multiplicity of global decoders capable of generating a logical 0 when selected and a logical 1 when de-selected in said read, erase, erase verify and program verify modes, and said logical 1 when selected and said logical 0 when deselected in said program mode, said multiplicity of global decoders corresponding to one of said sectors;

a multiplicity of control logic circuits within each said sector, each of said control logic circuits including a transfer circuit that passes said logical 0 to selected global word lines and said logical 1 to deselected global word lines in said read, erase, erase verify and program verify modes, and an inverter circuit that inverts said logical 1 into said logical 0 for selected global word lines and said logical 0 into said logical 1 for deselected global word lines in said program mode; and a multiplicity of local decoders within each said memory sector, each said local decoder having local control input circuitry and being capable of combining the outputs of said control logic circuits with said local control input circuitry to switch said logical 0 to selected word lines and said logical 1 to deselected word lines in said program mode, and switch said logical 1 to selected word lines and said logical 0 to deselected word lines in said read, erase, program verify and erase verify modes.

2. The control circuitry of claim 1, wherein:

in the read mode said logical 0 is 0 V and said logical 1 is between 0.8 V and 6 V;

in the erase mode said logical 0 is 0 V and said logical 1 is between 6 V and 21 V;

in the erase-verify mode said logical 0 is 0 V and said logical 1 is between 0.8 V and 6 V;

in the program-verify mode said logical 0 is 0 V and said logical 1 is between 0.8 V and 6 V; and in the program mode said logical 0 is between −2 V and −21 V and said logical 1 is 0 V.

3. The control circuitry of claim 1, wherein said control logic circuit comprises six MOS transistors, two of the MOS transistors being arranged in parallel acting as said transfer circuit in all of the modes except the program mode and four of the MOS transistors being arranged in series acting as said inverter circuit in the program mode.

4. The control circuitry of claim 3, wherein said two MOS transistors acting as said transfer circuit comprise:

a n-channel transfer transistor whose gate, input, output and body are coupled, respectively to a CTLB signal, the output of the corresponding global decoder, the input of the local decoders for the corresponding sector and a Vpn signal which is the most negative signal available in the control circuitry for each said mode; and a p-channel transfer transistor whose gate, input, output and body are coupled, respectively to a CTLA signal, the output of the corresponding global decoder, the input of the local decoders for the corresponding sector and a Vpp signal which is the most positive signal available in the control circuitry for each said mode;

wherein the Vpp and Vpn signals can be pumped signals in at least one of the modes;

such that, in the program mode:

the CTLA signal follows the Vpp level so that no leakage path results at the onset of programming caused by unintended operation of the p-channel transfer transistor, and the CTLB signal is set to 0 V so that no leakage path results at the onset of programming caused by unintended operation of the n-channel transfer transistor.

5. The control circuitry of claim 3, wherein said four MOS transistors acting as said inverter circuit comprise:

first and second n-channel transistors;

first and second p-channel transistors;

said first p-channel transistor having a gate coupled to the CTLB signal and a source coupled to the Vpp signal;

said second n-channel transistor having a gate coupled to the CTLA signal and a source coupled to the Vpn signal;

said second p-channel transistor having a gate, source and drain coupled to the output of the global decoder, the source of the first p-channel transistor and the drain of the first n-channel transistor; and said first n-channel transistor having a gate, source and drain coupled to the output of the global decoder, the drain of the second n-channel transistor and the drain of the second p-channel transistor;

such that, for the program mode, the CTLA signal follows Vpp so that the second n-channel transistor is off, preventing leakage at onset of the program mode by discharging the global word line to VSS.

6. The control circuitry of claim 5, wherein the CTLB signal coupled to the gate of the first p-channel transistor is used to control when the Vpp signal is coupled to a respective selected global word line.

7. The control circuitry of claim 1, wherein said control logic circuit comprises three n-channel and three p-channel MOS transistors.

8. The control circuitry of claim 1, wherein said control logic circuit comprises five transistors, two of the MOS transistors being arranged in parallel acting as said transfer circuit in all of the modes except the program mode and three of the MOS transistors being arranged in series acting as said inverter circuit in the program mode.

9. The control circuitry of claim 8, wherein said two MOS transistors acting as said transfer circuit comprise:

a n-channel transfer transistor whose gate, input, output and body are coupled, respectively to a CTLB signal, the output of the corresponding global decoder, the input of the local decoders for the corresponding sector and a Vpn signal, which is the most negative signal available in the control circuitry for each said mode; and a p-channel transfer transistor whose gate, input, output and body are coupled, respectively to a CTLA signal, the output of the corresponding global decoder, the input of the local decoders for the corresponding sector and a Vpp signal, which is the most positive signal available in the control circuitry for each said mode;

wherein the Vpp and Vpn signals can be pumped signals in at least one of the modes;

such that, in the program mode:

the CTLA signal follows the Vpp signal so that no leakage path results at the onset of the programming caused by unintended operation of the p-channel transfer transistor; and the CTLB signal is set to 0 V so that no leakage path results at the onset of programming caused by unintended operation of the n-channel transfer transistor.

10. The control circuitry of claim 8, wherein said three MOS transistors acting as said inverter circuit comprise:

first and second n-channel transistors; and a first p-channel transistor;

said second n-channel transistor having a gate coupled to a CTLA signal and a source coupled to the Vpn signal;

said first n-channel having a gate, source and drain coupled to the output of the global decoder, the drain of the second n-channel transistor and the drain of the second p-channel transistor;

said first p-channel transistor having a gate coupled to the output of the global decoder, the drain of the first n-channel transistor and a source coupled to the Vpp node;

such that, for the program mode, the CTLA signal follows Vpp so that the second n-channel transistor is off, preventing leakage at onset of the program mode by discharging the global word line to VSS.

11. The control circuitry of claim 1, wherein said local decoder comprises four MOS transistors, the first two said transistors being p-channel transistors located near one end of said word line and the second two transistors being n-channel transistors and being located near the same end of said word line.

12. The control circuitry of claim 1, wherein the global decoder requires level-shifted high voltage inputs (Vpp and Vpn) so that no level-shifting circuitry is required in the tight pitch of local word line decoders.

* * * * *